United States Patent [19]

Dotter, Jr.

[11] 4,143,363
[45] Mar. 6, 1979

[54] NONUNIFORM TRANSLATION BETWEEN ANALOG AND DIGITAL SIGNALS BY A PIECE-WISE LINEAR PROCESS

[75] Inventor: Berton E. Dotter, Jr., Belmont, Calif.

[73] Assignee: GTE Automatic Electric Laboratories, Inc., Northlake, Ill.

[21] Appl. No.: 488,337

[22] Filed: Jul. 15, 1974

Related U.S. Application Data

[63] Continuation of Ser. No. 302,332, Oct. 30, 1972, abandoned.

[51] Int. Cl.² .......................................... H03K 13/02
[52] U.S. Cl. ............................................ 340/347 AD
[58] Field of Search ................. 340/347 AD, 347 DA

[56] References Cited

U.S. PATENT DOCUMENTS

| | | | |
|---|---|---|---|
| 3,016,528 | 1/1962 | Villars | 340/347 AD |
| 3,180,939 | 4/1965 | Hall | 340/347 AD |
| 3,234,544 | 2/1966 | Marenholtz | 340/347 AD |
| 3,487,304 | 12/1969 | Kennedy | 340/347 DA X |
| 3,510,868 | 5/1970 | Chatelon | 340/347 DA |
| 3,544,993 | 12/1970 | Gabriel | 340/347 AD |
| 3,573,795 | 4/1971 | Bowers | 340/347 DA |
| 3,573,802 | 4/1971 | Kawashima | 340/347 AD |
| 3,582,941 | 6/1971 | Le Maout | 340/347 DA |

Primary Examiner—Charles D. Miller
Attorney, Agent, or Firm—Leonard R. Cool

[57] ABSTRACT

A weighted resistance network under control of combinational and sequential logic circuits provides a separate reference voltage at each of the digit times of the pulse code for comparison with an amplitude sample at the coder input. The difference voltage is used to derive the pulse code which is compressed in a piece-wise manner because of the use of a weighted resistance network. A decoder operates in a similar manner to produce a quantized output from a weighted network under control of a logic circuit responsive to the incoming uniform pulse code.

6 Claims, 7 Drawing Figures

NONUNIFORM TRANSLATION BETWEEN ANALOG AND DIGITAL SIGNALS BY A PIECE-WISE LINEAR PROCESS

This is a continuation of application Ser. No. 302,332, filed Oct. 30, 1972 now abandoned.

BACKGROUND OF THE INVENTION

This invention relates to the nonuniform translation of analog signals and digital signals, one to the other, using piece-wise linear processes to approximate a modified logarithmic response characteristic in the coder and decoder. The nonuniform translation in particular yields a companding effect during the conversion process with volume compression or expansion as appropriate.

The translation processes disclosed in this invention relate to digital transmission, and in particular transmission by PCM (Pulse Code Modulation). The advantages of PCM over other forms of modulation are well known in the art. See, for example, the article "Philosophy of PCM," by Oliver, Pierce, and Shannon, in volume 36, Proceedings of the I.R.E., pages 1324–1331 (1948). The distinct advantage of the transmission of information by PCM is that the information is digital in nature and may therefore be regenerated by repeaters employed along the transmission path. The regeneration process substantially eliminates the accumulation, in the course of transmission, of noise, crosstalk, and other forms of signal degradation.

Prior to transmission, coding (i.e., conversion of the original analog information to a pulse code) is necessary in a PCM system; and if the digital information thus transmitted is to be used in its original form upon its reception, decoding is necessary.

During encoding of the original information it is necessary that the coder output be quantized. In the quantizing process the exact value of the information at any instant is approximated by one of a number of discrete codes. Information is thus represented by a discrete number of quantum levels. The difference between the instantaneous value of the original information and the quantum level actually transmitted is known as quantizing error and gives rise to what is called either quantizing noise or quantizing distortion. If the quantum levels are chosen in regular intervals through the signal amplitude range, it is apparent that the percentage error will not be constant for samples of all sizes. In this case, the large signals can tolerate rather large quantizing noise figures while maintaining a reasonable percentage of error, while smaller signals yield a greater percentage of error for comparable quantizing noise levels. Thus, it is desirable to keep the signal-to-quantizing noise ratio at a fairly constant value over the signal amplitude range. In order to maintain a constant value, it is necessary to have more quantum levels available at low signal amplitudes. In this way, the low signal amplitudes are more accurately defined, thereby reducing the quantizing error.

One technique that is used, in the reduction of quantizing noise, is volume compression and volume expansion, which is well-known, to those skilled in the art, as companding. In companding, the number of quantizing levels in the small signal range are more numerous than in the larger amplitude ranges; that is, they are compressed in the smaller signal range. The express purpose of companding is the maximization of the ratio of average signal-to-quantizing noise over the amplitude range. In this manner, quantizing noise is rather evenly distributed on a percentage basis, and is relatively minimized. It is noteworthy that companding is an inherently nonlinear process, with the prevalent companding functions being either logarithmic or hyperbolic functions.

Companding requirements are different for signals having different characteristics. In order to obtain an acceptable level of quantizing noise, voice signals require constant signal-to-distortion ratios over a wide dynamic range. In particular, additional quantizing steps are required for the low signal amplitudes. The quantizing distortion should be proportional to signal amplitude for any signal level, which means that for voice signals a logarithmic compression law should be used. For a discussion of the logarithmic compression law and practical methods for modifying same, reference may be made to the wealth of publications on this subject. In particular the now well-known $\mu$-law modification of the logarithmic function is discussed in detail in an article by B. Smith, "Instantaneous Companding of Quantized Signals," *Bell System Technical Journal*, vol. 36, May 1957, pp. 653–709. An expression for the $\mu$-law characteristic over a normalized coding range of $\pm 1$ is:

$$F(x) = sgn\ (x) \frac{l_n(1 + \mu|x|)}{l_n(1 + \mu)}$$
$$\text{where } -1 \leq x \leq 1.$$

Where x is small, the F(x) approaches a linear function, and for a large x it approaches a logarithmic function. The range of signal power over which the signal-to-distortion ratio is relatively constant is determined by the parameter $\mu$. For a relatively constant signal-to-distortion ratio over a 40-dB dynamic range $\mu$ should be greater than 100.

A second method of approximating the true logarithmic law is described by K. W. Cattermole, in a discussion on a paper by R. F. Purton, *Proc. IEE*, vol. 109, Part B, pp. 485–487, in which a true logarithmic curve is smoothly joined to a linear segment at low levels. The expressions for this A-law characteristic is given by the following expressions:

$$F(x) = sgn\ (x) \frac{1 + l_n A|x|}{1 + l_n A}$$
$$\frac{1}{A} \leq |x| \leq 1$$
$$F(x) = sgn\ (x) \frac{A|x|}{1 + l_n A}$$
$$0 \leq |x| \leq \frac{1}{A}.$$

The two logarithmic laws can be approximated by nonlinear devices such as diodes, and these laws can also be implemented by a piece-wise linear approximation using several segments.

The digitally linearizable laws are an interesting class of piece-wise linear compression laws. These laws are characterized by the property that the coding intervals, which are equal within each segment, are integral multiples of the size of a smallest coding interval.

Of particular interst for binary word coders are the cases where the coding intervals are related by powers of two, and each linear segment contains an equal number of coding intervals. The A-law and $\mu$-law characteristics described above are of this type. For a more detailed discussion see E. J. Anderson, "Considerations in Selection of a $M\mu = 255$ Companding Characteristic," 1970 *International Conference of Communications*, vol. 19, pp. 7-9-7-19. For example, 8 segments on each side of 0 are commonly used. If the size of the coding intervals with each segment doubles for each segment outward from the center, a 15-segment digitally linearizable law results, which approximates the $\mu$-law characteristic with $\mu = 255$. The ratio of the largest to smallest coding interval (the compression factor) is $2^7 = 128$; the compandor improvement for small signals is 30 dB. If the center 4 segments of the 8 original segments on each side of 0 are made co-linear, with the coding intervals of the remaining outer segments doubling in size as before, a 13-segment digitally linearizable compression law is achieved. This compression law approximates the A-law characteristic, matching the slope at the origin with $A = 87.6$. The compression factor is $2^6 = 64$; the companding improvement for a small signal is 24 dB.

Traditionally, practical PCM systems have featured separate compression and linear encoding units at their transmitting end as well as separate linear decoding and expanding units at the receiving ends. Within the past few years, PCM systems have been developed in which the companding and coding functions have been combined. Typical of the techniques used in combining of the coding and companding functions is illustrated by the system disclosed by R. L. Carbray in U.S. Pat. No. 2,889,409. Exemplary of the Carbray invention is the transmitting end of the system in which a nonlinear encoder automatically compresses its input signal as it carries out its coding operation. B. D. Smith discloses a method of nonlinear encoding by feedback methods in an article entitled, "Coding by Feedback Methods," which appears in volume 41 of the *Proceedings of the I.R.E.* at page 1053. Another such technique is disclosed by Bonami et al in U.S. Pat. No. 3,653,033.

While the method of conversion between analog and digital information which has been disclosed by Carbray, Smith, and Bonami et al. has many advantages, the objects attained by the presently disclosed invention and the features and advantages thereof constitute an important contribution to the field of the PCM communication.

It is a principal object of this invention to use the characteristics of nonuniform coding and decoding such that the implementation is achieved in a simple and straightforward and inexpensive manner. Another object of the invention is that high accuracies are not required for any of the circuit components.

Still another object of the invention is to readily maintain the monotonicity at the intercepts of the signals for the piece-wise linear approximation of the companding characteristic. Further, the co-linearity of the two segments about zero is maintained. This latter results in a near perfect symmetry in the coder response for both positive and negative signals.

SUMMARY OF THE INVENTION

In an illustrative embodiment of the present invention, a PAM input signal is applied to a sample-and-hold circuit which holds constant the signal sample amplitude during encoding. Selected elements of a weighted resistive network are connected to a current generator source via gates controlled by sequential and combinational logic. Reference voltages are thereby generated for comparison with the unknown PAM amplitude sample in a comparator using voltage comparison techniques. The comparator will accept both positive and negative PAM sample amplitudes and will compare these against a positive reference. By so doing, the $\mu$-law characteristic need only contain the 8 segments of the first quadrant to represent the full 15-segment characteristic. A first reference voltage is generated which is independent of the input sample and of the comparison voltage differential output and is used in determining the sign, i.e., the polarity, of the pulse amplitude sample. A second generated reference voltage is also independent from the comparator output and the coding means and is used to determine whether or not the amplitude sample resides in the upper or lower half of the compandor characteristic. Subsequent comparisons are made which are dependent upon the difference between the reference voltage and the sample amplitude. The weighted network adds or subtracts elements, under network logic control, until the weighted voltage is within the quantization step of the sample amplitude. At each comparison step an element of the permutation code is generated and the binary representation either "1" or "0" depends on whether the signal sample is greater or less than the reference voltage. Following the polarity digit, the first few digits of the permutation code select the segment which has an amplitude that is within the quantizing range of the PAM input sample to be coded. The remaining digits of the permutation code select the actual location of the quantizing voltage within the segment.

A decoder which provides expansion to the original signal amplitude, within the quantization interval, is obtained by using the basic elements of the coder described hereinabove. The input is the permutation code which sets the weighted network output voltage by means of logic and the code input signals. Instead of a comparator, the output voltage of the reference network is applied both to a through circuit and to an inverting amplifier. The polarity digit selects the appropriate output to provide the positive or negative quantized PAM signal.

DETAILED DESCRIPTION

Figure 1:
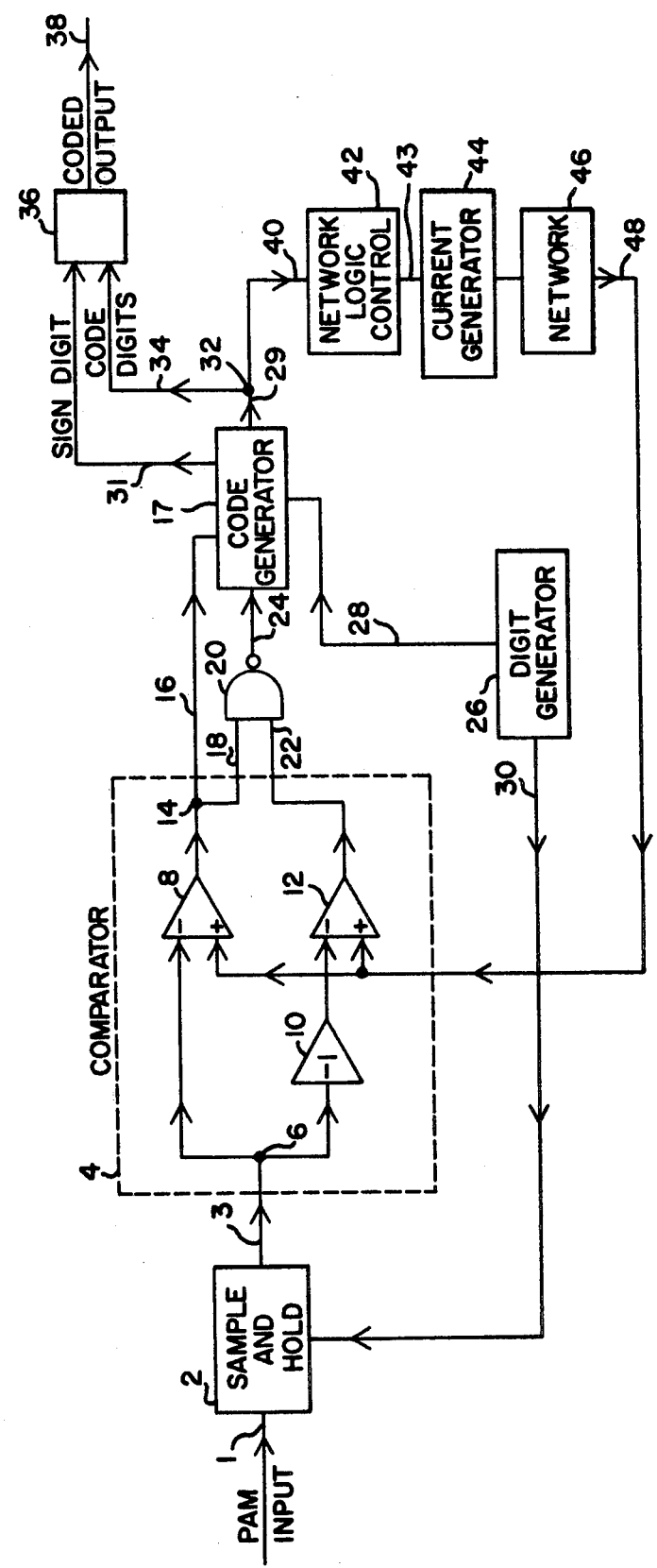
FIG. 1 is a block diagram of the coder including the sample-and-hold circuit.

In the process of coding an analog signal, samples of the analog signal must be selected on a timed basis, and the amplitudes of the signal samples must be held, or stored, sufficiently long to provide the time necessary for encoding of the signal sample. Referring to FIG. 1, digit generator 26, via path 30, supplies a first digit pulse of a first time to enable the sample-and-hold circuit 2 and a second digit pulse at a predetermined later time which disables the sample-and-hold circuit. As is well known in the art, in order to reproduce with a reasonable degree of accuracy the analog signal input, the sampling rate must meet the criteria of the sampling theorem. This theorem states in effect that sampling must be at a rate (frequency) which is at least twice that of the highest frequency contained in the signal to be sampled.

Since techniques for sampling of an analog signal in accordance with the sampling theorem are well known, these are not illustrated in the figures of the subject invention. Referring now to FIG. 1, there is a pulse amplitude-modulated input, hereinafter PAM, supplied on lead 1 to a sample-and-hold circuit 2. The sample-and-hold circuit is used to hold the signal sample for the time period necessary to complete the coding process. Sample-and-hold circuits are also well known in the art and, therefore, are not illustrated in detail in the figure. It should be noted that the signal sample is held and applied on output lead 3 during the time interval established by digit generator 26 via digit generator input information to the sample-and-hold circuit 2 via lead 30. It is also important to note that the PAM sample may be either positive or negative since the actual sample may be derived from an analog signal.

Coding of the signal sample may be accomplished by assigning an n-digit code to each signal sample for each quantizing level, and this would include both positive and negative values of the signal sample. As an alternative, the sign of the signal sample, whether positive or negative, may be used as one digit of the n-digit code with the remaining digits specifying the actual location, amplitudewise, of the signal sample. In the instant invention, the latter technique is used because it offers a number of simplifications with respect to circuitry required for identifying the signal samples and for the encoding thereof. For example, only a single network, a single logic control and a current generator source are required, and this only need operate at one polarity.

In order to derive the code for a signal sample, the amplitude of the signal sample must be compared against a reference voltage or a series of reference voltages. In the instant invention, the PAM sample is applied to a comparator 4 via lead 3 to junction 6. The comparator as illustrated has two circuits connected to junction 6, one of which applies an input directly to a differential comparator 8, the other of which includes an inverting operational amplifier circuit 10 and a separate differential comparator 12 in order to account for the polarity differential that might exist in the amplitude samples. The pulse amplitude sample will be applied to both circuits simultaneously; however, where the sample is positive, only differential comparator 8 will be directly involved in the development of the n-digit code, which identifies the signal sample. Conversely, where the pulse amplitude sample is negative, inverter amplifier 10 and differential comparator 12 are involved in the development and comparison of the signal sample with respect to a reference voltage as to attain an n-digit code, identifying the negative amplitude sample. The polarity is obtained from the output of differential comparator 8 as before, however. As will be described hereinafter, the output from network 46 via lead 48 applies a voltage for the initial digit, digit time $D_1$, which is approximately zero so that if the amplitude sample is positive, differential comparator 8 will have an output which output is applied via junction 14 and lead 16 to code generator 17, and this digit of the n-digit code is identified in code generator 17 and passed via lead 31 to parallel-to-serial converter 36 as the sign (or polarity) digit. Thus, the polarity of the amplitude sample is identified; should the amplitude sample be negative, for example, then differential comparator 8 will have a one output; this information also is passed through junction 14, lead 16, code generator 17, lead 31, and parallel-to-serial converter 36 to identify the negative sign of the signal sample.

Following identification of the sign digit, the network logic control 42 using combinational logic will connect current generator 44 to resistance combinations of network 46 in such a way that a sum of the elements of a set of reference voltages will appear on lead 48 for comparison with the input signal sample amplitude of each digit time. The output of either differential comparator 8 via junction 14 on lead 18 or the output of differential comparator 12 via lead 22 will enable gate 20, which in turn will apply the code identification information to code generator 17 via lead 24. The output of code generator 17 will either be a 1 or a 0, and this is applied via junction 32 and lead 40 to network logic control 42. The 1's and 0's applied to network logic control 42 indicate whether the amplitude sample is greater or less than the network output voltage applied via lead 48 to differential comparators 8 and 12. It is the response of the network logic control to this comparison because of the 1 or 0 input following the comparison that selects the logic arrangement necessary to provide an appropriate voltage output from the network 46.

In a piece-wise linear coder, the encoding characteristic which most often has some form of compression is approximated by a series of linear segments. In the encoding process exemplified by this invention, the first digits following the sign digit identify the segment within which the pulse amplitude sample under consideration is located and the remaining digits identify the amplitude of the sample, at least within the quantizing level. The manner in which the instant invention accomplishes this result is explained hereinbelow.

Figure 2:
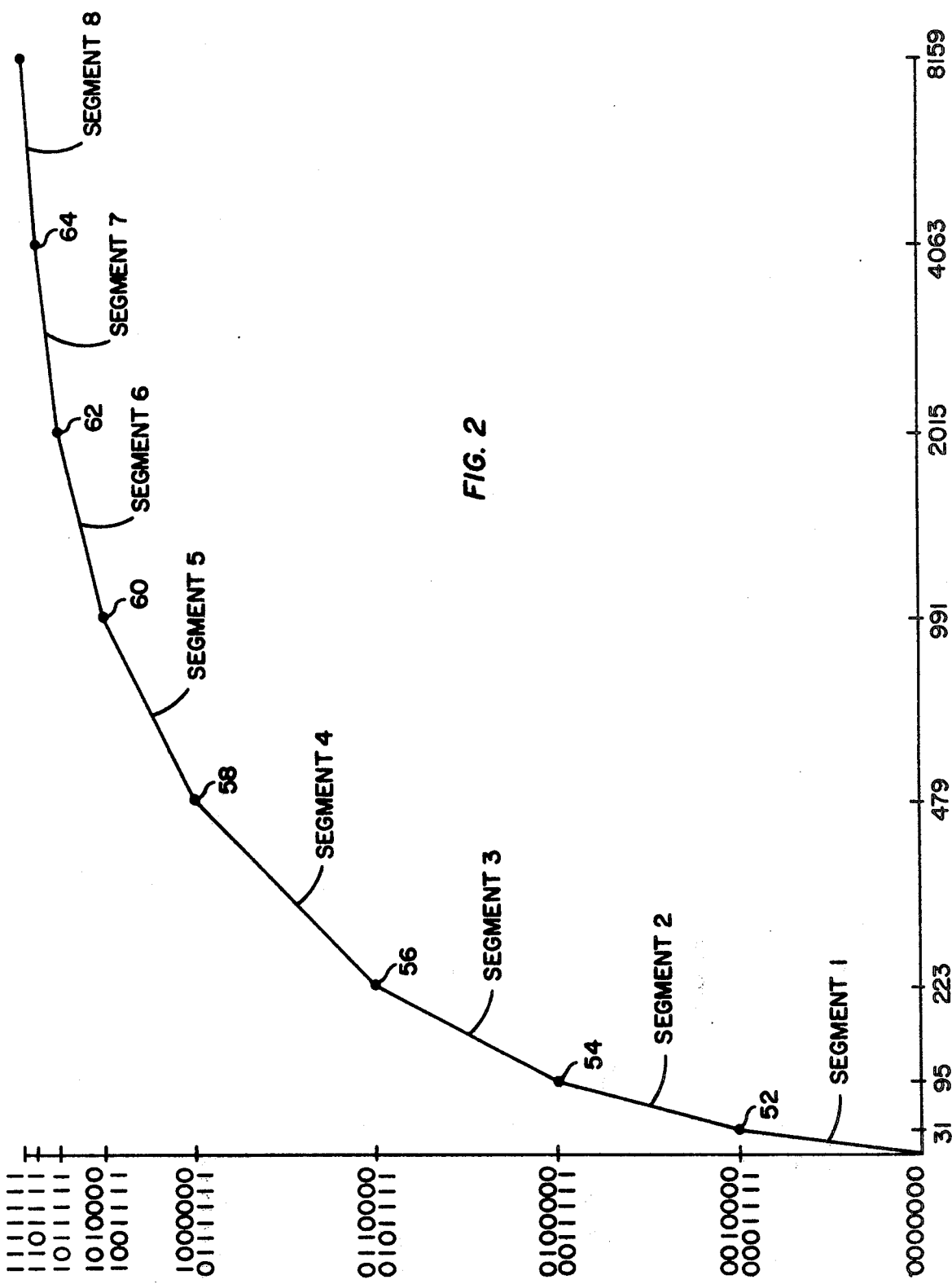
FIG. 2 is a graph of a piece-wise linear characteristic that approximates the $\mu = 255$ logarithmic companding law. Only the segments for the first quadrant of characteristic are shown since only positive signal amplitudes are used in the encoding and decoding processes. A sign bit is used to establish the actual polarity of the signal sample.

An important consideration in any piece-wise linear approximation of a logarithmic compression characteristic is the monotonicity at the intercepts of the segments. Further, the co-linearity of the two segments about 0 must be maintained. As noted hereinabove, the approximation of the $\mu$-law characteristic, in which $\mu$ = 255, may be approximated by a piece-wise linear 16-segment characteristic. Because two of these segments are centered about 0, the characteristic is known as a 15-segment approximation, and this is true where the two adjacent segments at the quandrant intersection, i.e., segments about 0, are co-linear. Referring now to FIG. 2, we see an 8-segment characteristic shown for the first quadrant. Note that this same 8-segment approximation may be used for both the positive and negative amplitudes of the PAM sample where the first digit of the code is used to identify the sign or polarity of the sample. In a preferred embodiment of applicant's invention, the first code digit, also referred to as the sign bit or polarity bit, is determined by comparing the PAM sample signal with a zero-volt reference from the network. In one practical implementation, a small positive voltage equal to ½ the amplitude of the smallest quantum level is used to insure that the sample is, in fact, greater than or less than this fixed small voltage. This causes a slight offset from the coordinate junction but, thereby, insures that the amplitude response characteristic passes through zero. The unknown signal voltage amplitudes may therefore be conveniently arranged over equal positive and negative values with respect to the system signal ground reference. By providing an inverting amplifier in the signal path of differential comparator 12, positive ranges of signal are always available, either directly or from the inverting amplifier. In this way, the network need only generate one polarity of reference voltage for determining either a positive or a negative unknown signal voltage input. It is not necessary to rectify the input PAM which is done by some coders thus avoiding the distortion at the crossover, which is inherent in rectifiers. It is easier to build a fast inverting amplifier than a high-speed rectifier. In addition to reducing a polarity of the reference voltages to one, another important advantage is that near perfect symmetry in the coder response is maintained for positive and negative signals. Further, co-linearity of the two segments about zero is more easily maintained.

Figure 3:
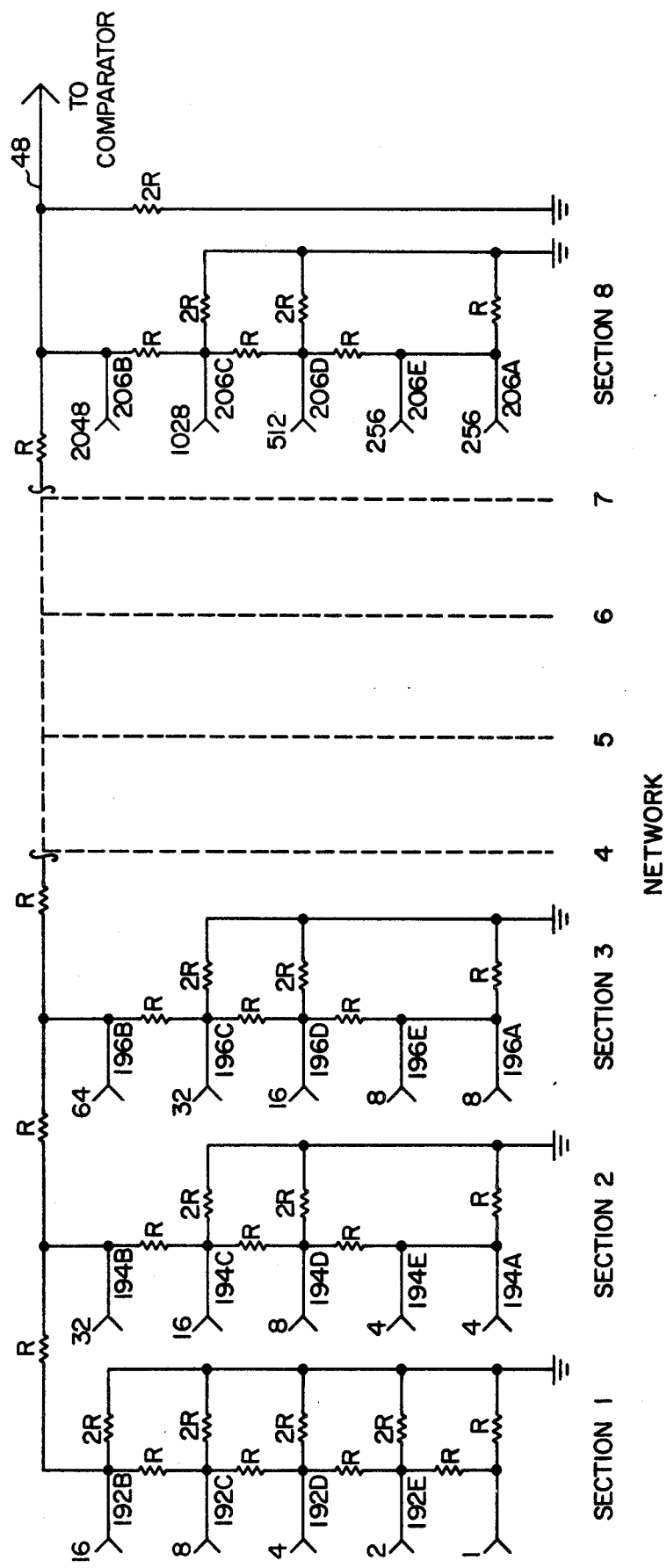
FIG. 3 is a circuit diagram which illustrates the weighted resistance network.

An 8-section network is shown in FIG. 3. Sections 4–7 are not shown in detail because of space limitations in the drawing but it should be understood that these sections are identical to sections 2 and 8. Each network section corresponds to one segment of the characteristic shown in FIG. 2, and the numerical designation of the section directly corresponds to the numerical designation of the segment. Each network section has 5 inputs. The combinational logic circuitry connects the appropriate inputs of each network section to the current generator 44, FIG. 1, which supplies a constant current of equal magnitude to each input of each network section that is connected because of the gating circuits actuated by the network control logic. Thus, a reference voltage is generated for comparison with the input sample for each digit of the n-digit code. Current generators such as 44 are well known in the art. Thus it was not felt that a detailed description was necessary. All of the network sections could be the same; however, network section 1 is different at the 1 and 2 input points, and the 1 input is always connected in order to provide an offset which permits maintenance of the required co-linearity of the two segments adjacent to the zero point and insures that the zero characteristic passes through zero, as noted hereinabove. In effect, each network section has 5 current input connections 4 of which are able to form 16 combinations while the 5th current input is used to generate the first quantum step reference voltage of a segment. Thus, the 8 network sections will generate a total combination of 128 steps, which is exactly the number of quantizing steps of the segmented characteristic as shown in FIG. 2. Further, the network divides each segment into 16 quantum steps; therefore, each network section represents one segment and each of its 16 current switch combinations represents one quantum step in that segment. In the preferred embodiment, where $\mu = 255$, the quantum steps double in size from a first segment to its next higher adjacent segment. The 16 quantum steps of any segment may be defined by one of the codes of a four-bit binary code.

In order to provide sufficient accuracy, the current generator, supplying constant current to each part of the network as required by the logic control, and the resistor weighting networks, only require an accuracy of ¼ of 1/16 or 1/64 of a quantum step in that network segment. Thus, the reference voltage for each quantum step in any segment is always within ½ of the smallest quantum step, or 1/32. The resistor network and the current generator are adjusted to produce quantized reference voltages for each segment that are within ±1.5%. Since the quantum step size doubles as one moves to the next higher adjacent segment, and, because the smaller step sizes are independent of any other segments, error accumulation is minimized, and, by holding the error in the lower segments to ±1.5% of the step size of the segment, the total error contribution of the lower segments, assuming an even distribution of errors, is double the individual error. This is most significant as advantage is taken of the doubling of quantum step size as the signal goes to higher segment ranges. A unit error in the first segment is reduced by ½ in the second segment, and by ¼ in the third segment, etc. Thus, by using the teachings of this invention, the desired accuracy of each quantum step is readily attainable without the requirement of a high accuracy for the elements used in the generation of the reference voltages which represent each quantum step. In fact, the accuracy of ±1.5% for the network and for the current sources is readily attainable using available components and without the use of elaborate selection techniques nor the use of special ovens or other devices to maintain the desired accuracy over normal operating temperature ranges.

The monotonic response between segments is inherent because the network uses the output from the lower weighted segments in order to arrive at the higher valued segment voltage amplitudes. All of the segment junction characteristic are similar in that the step sizes between the adjacent segments always have a ratio of 2:1, which is required for the 15 segment $\mu = 255$ characteristic. The reference voltages for coding are obtained from summing the appropriate voltages for each of the network sections except for the offset caused by permanent connection to a current generator of the first switch connection, connection 1, of section 1. The normalized voltage amplitudes that occur at the segment junctions are given on the abscissa of the compression characteristic shown in FIG. 2. Section 1 corresponds to segment 1 of the companding characteristic of FIG. 2, and it should be noted that by appropriate connection of the current generator connection points, the segment is divisible into 16 parts, thus permitting selection within 1/16 of the segment length. An amplitude value in segment 2 is derived by using the full amplitude value of segment 1 and by optionally connecting constant current sources to the connection points for section 2. Segment junctions 52, 54, 56, 58, 60, 62, and 64, FIG. 2, are double valued in that they may exist in either the lower segment or in the upper segment within ½ quantum step of the junction. Thus, the amplitude shown for each junction is not actually obtained. For example, the normalized maximum amplitude for segment 1 is 31 and the minimum normalized amplitude for segment 2 is 35; this is based on the doubling of the quantum steps where the steps in segment 1 are normalized to 2. (Note the exception as hereinabove explained for the first gate in section 1). Referring to FIG. 2, the codes identifying the segment junction are 0001111 (segment 1, amplitude 31) and 0010000 (segment 2, amplitude 35). Note that network section 2 has two input points that have the same normalized number — 4 — and these are the 4th and 5th inputs. The last four digits of the code for the segment 1 maximum amplitude are all 1's, which may be considered to mean that all inputs of network section 1 are connected to the constant current sources of the current generator. Looking at the code for the minimum amplitude of segment 2, all of the last four digits are 0's. Following the above reasoning, none of the first four inputs would be connected to the current generator. Note, however, that, excepting the sign digit which was not included in the codes shown hereinabove, the three segment selection digits change from 000 to 001. The amplitude associated with the 001 0000 code must include the voltage obtained from the entire first network section plus the first quantum step in the 2nd segment. Thus, the "1" in the fourth digit of the code (3rd following the sign digit, not included above) must: (a) connect the constant current sources of current generator 44 to each input of the first segment; and, (b) connect a current source, from 44, to the 5th input of the second segment. This will provide the proper reference amplitude for the first quantum step in the second segment. Note further that by making use of the second, third, and fourth digits (segment selection digits), eight codes are available, one for each segment. Therefore, the 5th current source of each network section controlled by the 3 segment digits provides the means to generate the first quantum step reference voltage of a segment. In the embodiment shown in FIG. 3, the 000 code is not used to connect the fifth input since it is permanently connected to the current generator. However, such an arrangement is possible and may be used in coders or decoders which employ the teachings of my invention. Similarly, segment junction 54, FIG. 2, between segments 2 and 3, has a minimum amplitude value which includes the sum of maximum amplitudes of network sections 1 and 2 and a maximum value which includes the minimum plus the amplitude of the first quantum step — 8 — of section 3. Thus, the companding characteristic shown in FIG. 2, which in this case follows the $\mu$-law, where $\mu = 255$, is developed step-by-step, using the network sections of FIG. 3.

Whenever a signal sample is placed in the sample-and-hold circuit, shown in FIG. 1, for coding purposes, the sample amplitude is compared in a comparator with the voltage amplitude generated by the network FIG. 3 under control of the code generator 17 output and network logic control 42.

Figure 4:
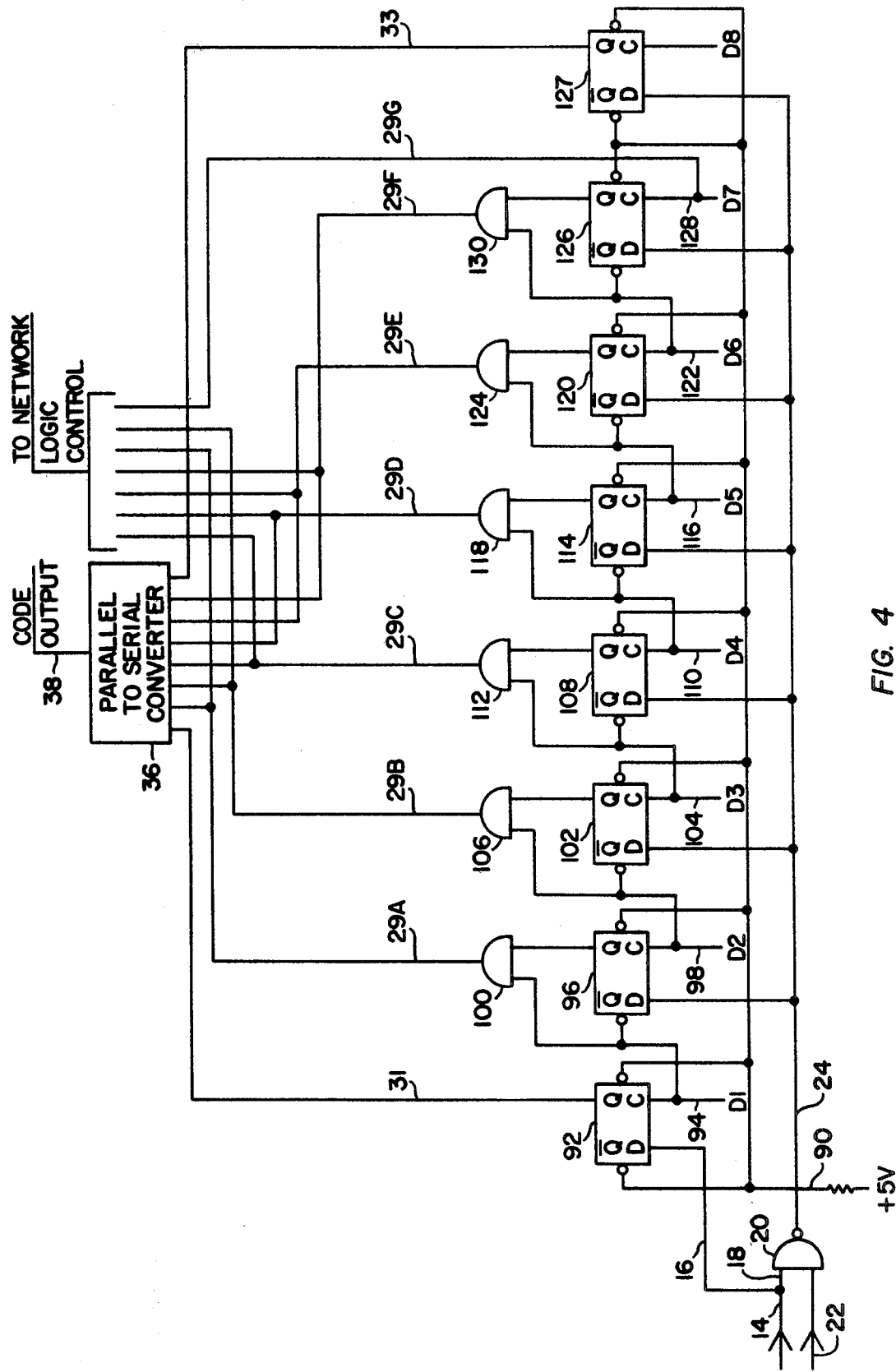
FIG. 4 is a block diagram of a code generator.

An example of a code generator that will provide the code output and the outputs to the network logic control in accordance with the teachings of this invention is shown in FIG. 4. In order to maintain reference to the generalized block diagram shown in FIG. 1, those elements which are duplicated from FIG. 1 are given the same identifying number. Or, for example, where a single path in FIG. 1 actually represents a number of separate circuit paths, the base number for the single path is used but a subscript letter is included. Single path 29, FIG. 1, is one example of the use of this cross-reference technique.

The code generator 17 consists essentially of registers 92, 96, 102, 108, 114, 120, 126 and 127 and gates 100, 106, 112, 118, 124, and 130. Gate 20 applies the binary result of the comparator output to registers 96, 102, 108, 114, 120, 126, and 127. Polarity information is applied directly from the output of differential comparator 8 via lead 16 to register 92. Clocking information is supplied by digit generator 26. Clocking information is supplied by digit generator 26, and the code bits B1, B2, . . . B8 are determined for each digit time D1, D2 . . . D8 depending on the comparator outputs which are applied to the inputs of the registers.

Between D8 and D1 time, all registers, except 92, are preset to 1, but all the bits from B2 through B7 are at logic 0 (gate outputs 100, 106, 112, 118, 124, 130, respectively) due to the AND-function with the digit pulse D1 through D6. At the beginning of the coding period at D1 time, the polarity, or sign bit, is applied via junction 14 and lead 16 to the D input of register 92. Gate 20 combines two comparator outputs and feeds the result to the input of the remaining seven registers. In addition to strobing the polarity bit into register 92, D1 also enables gate 100, which allows the first digit B2 to change from 0 to 1, which in turn changes the combinational logic to set the reference voltage to a proper value for the bit 2 comparison. At D2 time, the D2 pulse enables gate 106 (which changes B3 from 0 to 1) and also strobes the bit 2 compared result into the register 96 to finalize the bit 2 status. This finalized bit 2 information is stored in register 96 and remains unchanged until the end of the coding period. This enable and strobe operation is repeated for each register for each digit until the D7 time. At the D7 time, the digit pulse D7 strobes bit 7 compared result into the register 126, but has no gate to be enabled because the 8th bit reference voltage is controlled by D7 alone in the combinational logic circuit. The polarity bid and code bits B1–B8 are applied to a parallel-to-serial converter 36 and provide the code output on lead 38. The code bits are also applied to the network logic control circuitry.

The function of the network logic control, shown as 42, FIG. 1, is to control the network current source so as to develop predetermined voltages first for the selection of the polarity digit secondly to determine the segment within which the pulse amplitude of the signal sample resides, and thirdly to approximate the actual amplitude, within the limits of the network elements, of the pulse amplitude signal sample. As hereinabove noted, the sign bit is first obtained by comparing the pulse amplitude sample at D1 time with an approximate zero voltage applied from the network via lead 48 to operational amplifiers 8 and 12, as shown in FIG. 1. The network logic circuit at D1 time thus supplies an approximate zero voltage for comparison purposes. Following the determination of the sign bit, the logic control circuit causes the network current sources to produce a network output voltage which has a pulse amplitude comparison value that is equal to the junction voltage which evenly divides the 8 segments which, in this case, is a normalized voltage of 511. As can be seen in FIG. 2, the output voltage is that which would occur at junction 58. Thus, at D2 time the network control logic circuitry causes current generator connections to be made to each of the input points of network sections 1, 2, 3, and 4 plus the lowest reference of network section 5 of the weighted network shown in FIG. 3. This network output voltage is then compared with the PAM sample in comparator 4 shown in FIG. 1, and the comparator output is applied to gate 20 via lead 18 and 22. If the input from the network via lead 48 is greater than the absolute value of the pulse sample amplitude, the inputs to NAND-gate 20 are both 1. Note that if the PAM sample is positive then comparator 12 will have a "one" output during the coding interval and only comparator 8 operates to determine the code. On the other hand if the PAM sample is negative then comparator 8 has a "one" output during the coding interval and only comparator 12 operates to determine the code. Therefore, the signal polarity controls the comparator 5 automatically so that a rectifier is not required in the PAM path. The 1, 1 input to gate 20 causes a 0 output on lead 24, which is an input lead to code generator 17. Conversely, when the sample amplitude is greater than the network voltage, the inputs to gate 20 are 1 and 0, which provides a 1 output on lead 24. Referring again to FIG. 4, the comparator output is applied via gate 20 and lead 24 to the D inputs of sequentially clocked registers 96, 102, 108, 114, 120, 126 and 127. The Q outputs of the first six of these registers are connected to one input of AND-gate 100, 106, 112, 118, 124 or 130, respectively. The other input to the particular AND-gate is the preceding clock pulse. The output of each respective AND-gate is a 1 or 0 for the code digit time. The 1 output occurs when the pulse sample amplitude is greater than the reference voltage supplied by network 46, and is 0 when the reference voltage is greater. Thus, when the pulse amplitude sample is at maximum amplitude, the code digits are all 1, and this agrees with the compression characteristic shown in FIG. 2 for the maximum amplitude along the ordinate. The code output including the sign digit is applied via parallel-to-serial converter 36 to code output lead 38. The code digits, not including the sign digit, are also applied to the network logic control circuitry.

In constructing the pulse code for a PAM sample, the coder's first function is to determine the sample polarity, the second function determines the segment wherein the sample lies, while the final function determines where the sample lies within the selected segment. Following the determination of the sign bit, the next three code digits are used to determine the segment junction. At the beginning of the coding interval, i.e. at D1 time, the polarity, or sign bit, is applied via junction 14 and path 16 to the D input of register 92. As noted hereinabove, the sign of the PAM sample is determined by comparing the sample amplitude with a small positive reference voltage from network 46. If the sample is positive with respect to the reference, the D input will cause a 1 output from register 92 at D1 time. Conversely, if it is negative with respect to the reference, the D input will cause a 0 output from register 92. Note that the logic could be arranged to be the opposite of that stated above without changing the function or result that is obtained. The sign digit obtained from register 92 is next applied to serial-to-parallel converter 36 via path 31.

In a preferred embodiment of the invention 8 digits are used to define the quantum step of the signal amplitude according to the $\mu = 255$ characteristic shown in FIG. 2. In the instant invention, the first digit represents the sign of the sample amplitude and, as noted hereinabove, a significant improvement in the symmetry of the characteristic is obtained thereby which results in a reduction in the second-order harmonics generated by the coding process. The signal amplitude can occur in either the first or third quadrants, but will only need to be represented in the first quadrant since the first digit represents the sign, polarity, of the signal sample.

The next three digits are representative of the segment(s) which are below the signal sample amplitude. The following tale, Table I, gives the three digit code B2, B3, B4, which represents the various serially connected network sections that provide the amplitudes for the various segments. Note that for the higher segments, the lower segments must be included since the higher segment reference amplitudes are obtained by a summation of the lower segment sections.

TABLE I

| B2, B3, B4 Code | Segments |
|---|---|
| 0 0 0 | 0 |
| 0 0 1 | 1 |
| 0 1 0 | 1 & 2 |
| 0 1 1 | 1, 2 & 3 |
| 1 0 0 | 1, 2, 3 & 4 |
| 1 0 1 | 1, 2, 3, 4 & 5 |
| 1 1 0 | 1, 2, 3, 4, 5 & 6 |
| 1 1 1 | 1, 2, 3, 4, 5, 6 & 7 |

To determine within which segment the sample lies, the reference voltages must be selected in a logical manner. One method which permits selection according to the three-digit code is to initially provide a reference voltage that is equal to the maximum amplitude of the first four segments, i.e., digit code B2, B3, B4 = 100. The manner in which this is accomplished will now be described.

Figure 5:
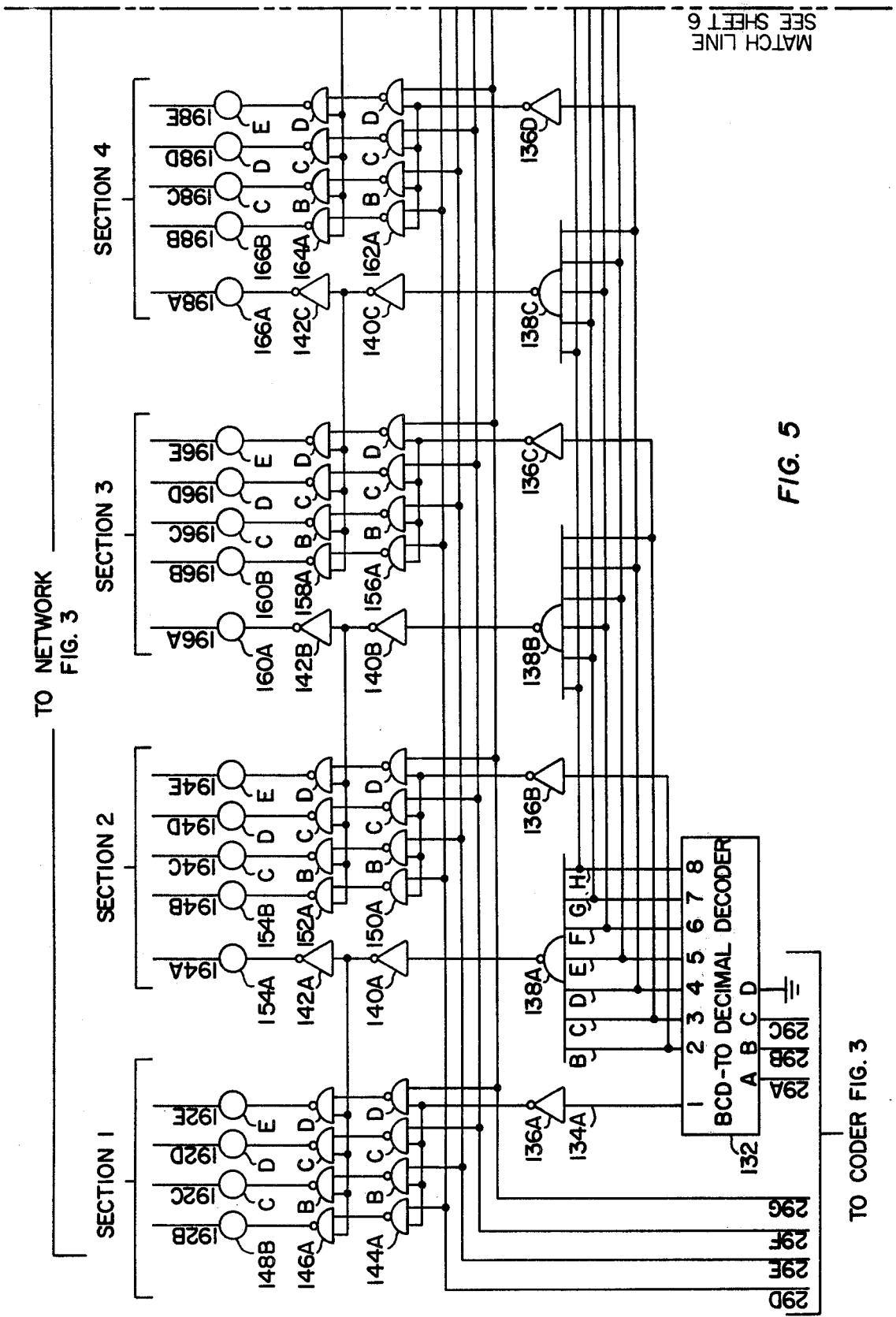
FIG. 5 is a block diagram of a network logic control arrangement that may be used to control connection of the current generator source to the network inputs and thus the reference voltage from the weighted network.
Figure 5:
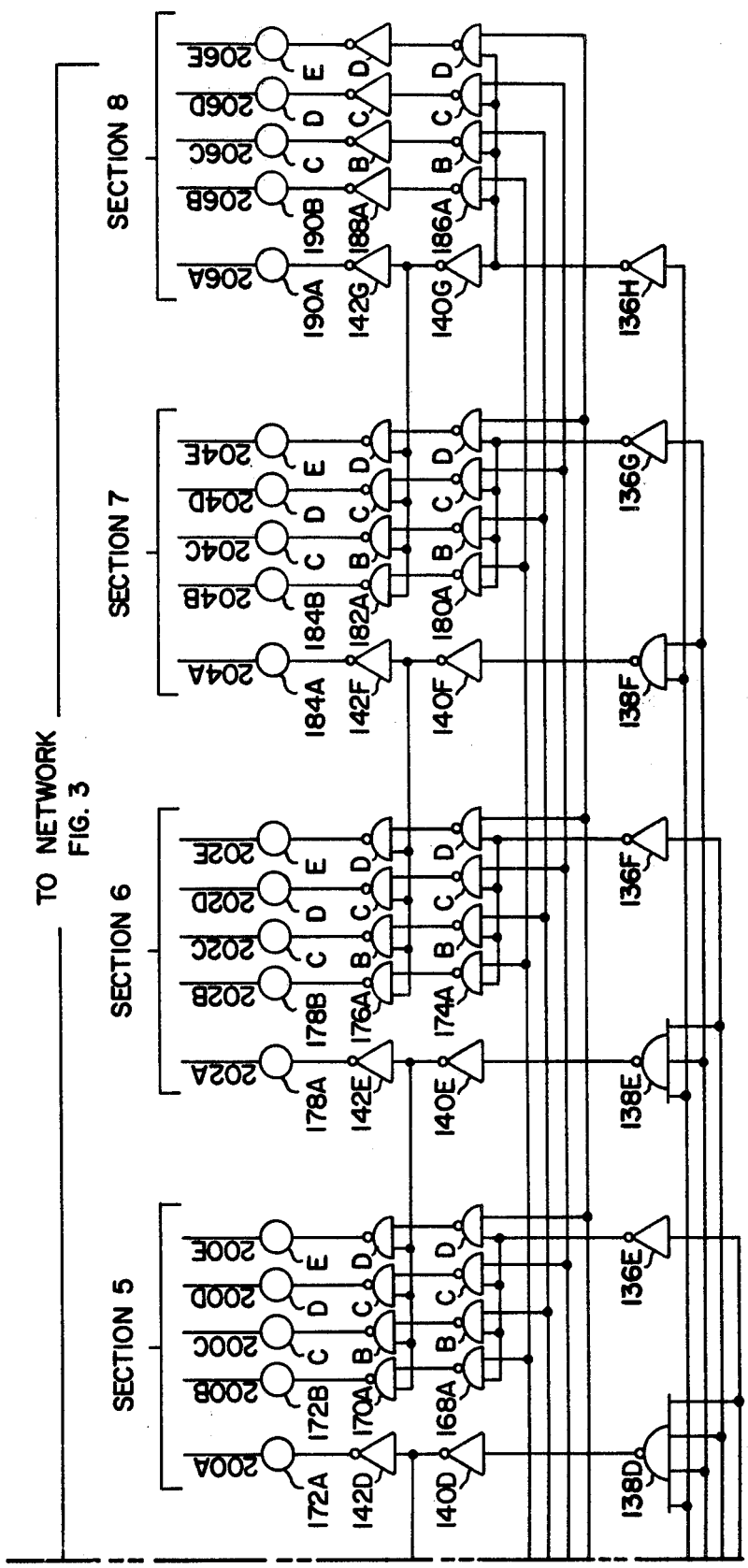

At D1 time, the D1 timing digit is also applied to register 96 and gate 100. Since register 96 was reset to have a 1 output between the D8 and D1 time periods, gate 100 will provide a 1 output which is applied to the network logic control via path 29A. At the same time the remaining registers 102, 108, 114, 120 and 126 each have a 0 output. The appropriate code, i.e., B2, B3, B4 = 100, is then applied to network logic control 42 via paths 29A, 29B, and 29C. These paths are shown in FIGS. 4 and 5. To translate the three-digit code B2, B3, B4 into binary information for control of the logic network, a Binary-Coded Decimal-to-Decimal Decoder, 132, FIG. 5, may be used. Binary-coded decimal-to-decimal decoders are well known in the art and integrated circuit versions such as the SN7445 are available commercially. Since these units will accept 4 binary inputs and will produce a 10-digit output, the connections must be selected to provide the 8-digit outputs which represent the eight three-digit code, B2, B3, B4, inputs. The following truth table, Table II, relates the input and output codes required from the BCD-to-Binary Decoder.

TABLE II

Truth Table

| Inputs | Outputs |
|---|---|
| A B C | 1 2 3 4 5 6 7 8 |
| 0 0 0 | 0 1 1 1 1 1 1 1 |
| 0 0 1 | 1 0 1 1 1 1 1 1 |
| 0 1 0 | 1 1 0 1 1 1 1 1 |
| 0 1 1 | 1 1 1 0 1 1 1 1 |
| 1 0 0 | 1 1 1 1 0 1 1 1 |
| 1 0 1 | 1 1 1 1 1 0 1 1 |
| 1 1 0 | 1 1 1 1 1 1 0 1 |
| 1 1 1 | 1 1 1 1 1 1 1 0 |

From this truth table the appropriate input and output connections of any such BCD-to-Decimal Decoder may be selected. Any logic arrangement that translates the B2, B3, B4 three digit input code into the eight-digit output shown for outputs 1, 2, 3, 4, 5, 6, 7, and 8 of Table II also will perform the desired logic operations as will be explained below.

Figure 6:
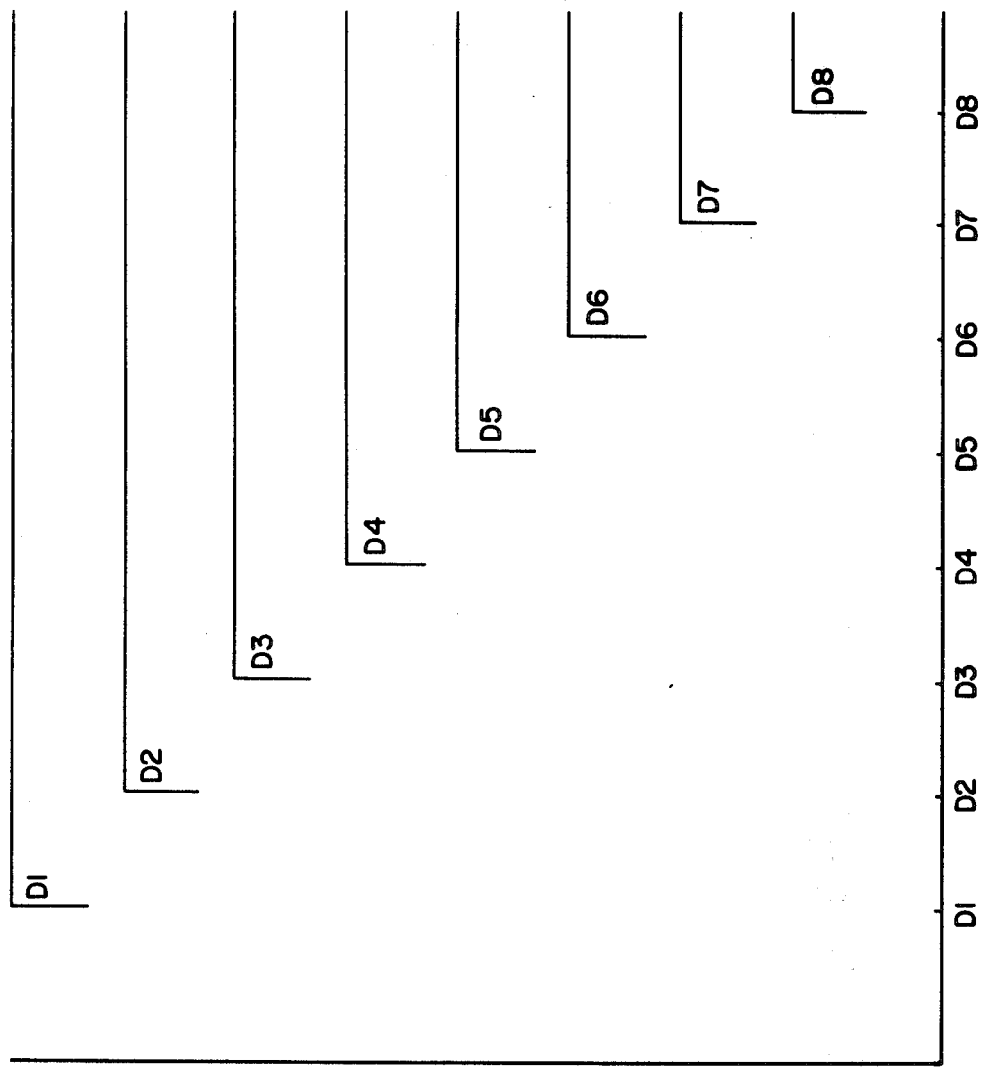
FIG. 6 is a timing diagram illustrating the characteristics of the digit timing $D_1$ through $D_8$.

Referring to FIG. 6, it should be noted that the state of the timing digit, once it is enabled, does not change during the coding interval. Thus D1 will apply a 1 to register 92 and to one of the inputs to gate 100 from the beginning of the coding interval at D1 time until the end of the coding interval at D8 time.

Again referring to FIGS. 4 and 5, the 1 output on path 29A is applied to the BCD-to-Decimal Decoder at the A input. All other inputs to the BCD-to-Decimal Decoder and to the network logic control on the leads designated by the base number 29 are 0. Referring to Table II, all of the outputs of the BCD-to-Decimal Decoder 132 are 1's except for a 0 at output 5. Inverter 136A will have a 1 input and will provide a 0 output to one input of each NAND-gate 144A, 144B, 144C, 144D. Since 0's are applied to the other input to each NAND-gate, via paths 29D, 29E, 29F, and 29G, each NAND-gate will have a 1 output. NAND-gate 138A will have a 1 output which is applied to the input of inverter 140A. Inverter 140A provides a 0 output which is applied to one input of each NAND-gate 146A, 146B, 146C, and 146D. These gates have 1 and 0 inputs so the output of each gate is a 1. Thus, the current input connections 192B, 192C, 192D, and 192E, are connected to the current generator source and current is applied to each input point of network section 1. It should be remembered that input 192A of section 1 is permamently connected to the current generator source and, therefore, the maximum voltage of section 1 is obtained. By similar analysis, it can be seen that with a 100 input to 132, at D1 time, all inputs of network sections 2, 3, and 4 also are connected to the current generator source causing each section to develop its maximum voltage. Further, it should be noted that input 200A which is the lowest quantum step of network section 5 is connected to the current generator source but that no other input of section 5 is connected to the current generator source. This establishes a voltage that includes the total of the first four sections plus the smallest quantum step (interval) of the fifth section, thus providing a normalized voltage of 511. Table III gives the normalized reference voltage for each element of a network section and the summation for each section.

TABLE III

| Segment | Normalized Outputs | | | | | |
|---|---|---|---|---|---|---|
| 1 | 1 | 2 | 4 | 8 | 16 | 31 |
| 2 | 4 | 4 | 8 | 16 | 32 | 64 |
| 3 | 8 | 8 | 16 | 32 | 64 | 128 |
| 4 | 16 | 16 | 32 | 64 | 128 | 256 |
| 5 | 32 | 32 | 64 | 128 | 256 | 512 |
| 6 | 64 | 64 | 128 | 256 | 512 | 1024 |
| 7 | 128 | 128 | 256 | 512 | 1024 | 2048 |
| 8 | 256 | 256 | 512 | 1024 | 2048 | 4096 |

A comparison of this reference voltage with the sample amplitude assures that the sample is either in the first four segments or is in the last four segments. If the sample amplitude is less than the reference, the comparator will provide a 0 output. The 0 will be strobed into register 96 at D2 and the B2 bit will be 0. Conversely, if the sample amplitude is greater than the reference, the comparator will have a 1 output and this output will remain 1 until the end of the coding period.

At D3 time AND-gate 106 is enabled and the code input to BCD-to-Decimal 132 will be either 010 or 110. Referring to Table II and FIG. 5, the reference will be developed, respectively, as a voltage summation of the first two segments plus the first quantum step of the third segment or as the summation of the voltages of the first six segments plus the first quantum step of the seventh segment.

The next four digits are used to determine the location of the quantized amplitude within the selected segment. A logic technique similar to that used for selecting the segment within which the pulse sample amplitude resided is used to determine the approximate location, i.e., the location within 1/16 of a segment length, of the pulse sample amplitude within the segment. In accordance with the comparator output information, the logic will first determine if the amplitude is in the upper or lower half of the segment. Subsequent comparisons will further subdivide the segment until the amplitude of the sample is less than $\frac{1}{2}$ of a quantum step from the amplitude of the reference. A logic arrangement which may be used for determining the final location of the pulse sample amplitude within a segment is also illustrated in FIG. 5.

A clearer understanding of how the coder functions to provide the desired output code for a particular amplitude sample may be obtained by using the compression characteristic of $\mu$ - 255 as shown in FIG. 3 and an 8-digit code. Let us assume that a PAM input sample having a normalized voltage of 200 is applied to sample-and-hold circuit 2 via input 1 and that this voltage is available for coding purposes during the normal coding interval via lead 3 to comparator 4. Let us further assume that the sample voltage is positive and thus from junction 6 to inverting amplifier 10 the PAM sample is converted to a negative voltage which is applied to the inverting input of differential comparator 12. Since the output voltage of a differential comparator depends only on the potential difference between the inverting ($e_-$) and noninverting ($e_+$) inputs and since further the output voltage $e_o = -Ae_s$ where $e_s = e_+ - e_-$, the differential comparator 12 will have a logic 1 output during the whole encoding period regardless of the values of the reference voltage. The normalized voltage of 200 is also applied to the inverting input of differential comparator 8 and at the same time, during the digit 1, D1 time interval, an approximate 0 voltage is applied to the noninverting input of the same amplifier; thus the output on lead 16 from operational amplifier 8 is a 1, which is applied to register 92, FIG. 4, and provides a Q output of 1 on lead 31, indicating a positive amplitude for the assigned digit. Next, the network output is changed to a normalized value of 511 by connecting the constant current generator source to all inputs of the first four sections plus the first input of the fifth section so that the reference voltage can be applied via lead 48 to the noninverting inputs of the operational amplifiers in comparator 4. As noted above, only the input to differential comparator 8 is significant, and in this case there is a difference between the two inputs with the reference voltage being the higher of the two. Thus, the output of amplifier 8 is a 1, which is applied to NAND-gate 20 via junction 14 and lead 18. Because operational amplifier 12 has a 1 output applied via lead 22 to a NAND-gate 20, the 1 and 1 inputs cause a 0 output on lead 24 to the input of code generator 17. This 0 is applied to the D input of register 96, FIG. 3, causing the output of the register to shift to 0; thus the inputs to gate 100 are 1 and 0, providing a 0 output which appears on lead 29A as the second code digit during D2 time. The code digit is applied via the output lead 29A to the Parallel-to-Serial Converter 36 and also via lead 29A to network logic control 42, FIG. 5. Referring now to FIG. 5, the 0 code input on lead 29A is applied to BCD-to-Decimal Decoder 132. Also, at the beginning of D2 time, the D2 timing signal is applied to one input of AND-gate 106. Again, the register is reset at the end of the previous D8 time which causes Q to have a 1 output. Thus, 1 and 1 inputs are applied to gate 106 which provides a 1 output on path 29B. The input now to BCD-to-Decimal Decoder 132 is 010. All decoder 132 outputs are 1 except output 3, which is 0. Thus, inverter 136A output is 0 and gates 144 outputs are each 1. Gate 138A output is 1 and inverter 140A output is 0. Gates 146 each have a 1 and 0 at their inputs so that their outputs are each 1. Thus, inputs of network section 1 are each connected to the generator source. Further, inverter 142A has a 1 output, which connects therefor the lowest quantum step of network section 2 to the current generator source. Inverter 136B also has a 0 output. Inputs to NAND-gates 150 and 0 and 0 thus providing 1 outputs. NAND-gate 138B has a 1 output. Inverter 140B has a 0 output. NAND-gates 152 have 1 and 0 inputs so that their outputs are each 1. The remaining inputs of network section 2 are thereby connected to the current generator source. At this point, a constant current is applied to every input of network sections 1 and 2. But note that inverter 142B has a 0 input and a 1 output thereby applying the constant current to the lowest reference level of network section 3. Thus, a normalized reference voltage of 103 is provided for comparison with the PAM sample amplitude. This time the reference voltage is less than the sample amplitude. In contrast to the previous digit time, the code digit remains a 1, and gate 106 remains enabled during the remainder of the coding interval. As before, the next digit is tentatively a 1 so that the code input to decoder 132 is now 011. The network output now includes the first three sections plus the lowest reference for section 4, giving a normalized reference voltage of 239. Since this is greater than the reference, the $D_4$ digit is changed to 0 by the comparison and subsequent logic so that the final code input to the decoder 132 is 010. Thus, the first two complete sections plus the lowest reference of the third section are the base. The normalized reference voltage is 103.

The last four digits of the code word are used to approximate the amplitude location within the segment. This is accomplished as follows in the preferred embodiment illustrated. The BCD-to-Decimal decoder input is fixed as 010 for our example amplitude and does not change during the remainder of the coding interval. Only inputs on paths 29D, 29E, 29F, and 29G change. Because of the logic as described above, only the states of NAND-gates 156 and 158 can now be changed. This permits the connection of the constant current generator to the different inputs of network section 3 only. These inputs are connected in a logical sequence such that the segment is divided in half at each step. First, AND-gate 118 will be enabled and a 1 will be applied via path 29D. This applies a 1 to one input of NAND-gate 156A. The other input to gate 156A is also a 1 since this is from the output of inverter 136C. NAND-gate 156A will thus have a 0 at its output which is applied as one input to NAND-gate 158A. The other input to gate 158A is a 1 which is obtained from inverter 140C. The 1 and 0 inputs now applied to gate 158A cause a 1 output and connects the constant current generator source to input 196B of network section 3. Referring to FIG. 3 it can be seen that this connects the generator to the midpoint of the network, i.e., the midpoint of the segment. The normalized reference voltage is now 103 + 64 = 167. Again, this is lower than the sample which has a normalized value of 200. Following the previous logic discussions, the register 114 is set to retain the Q = 1 output and, thus, gate 118 is enabled for the remainder of the coding interval. Next, a 1 is applied to path 29E at the beginning of D5 time. Following the logic arrangement in FIG. 5, gate 156B has a 0 output which changes the input to gate 158B causing 158B to provide a 1 output. Now inputs 196A, 196B, and 196C are connected to the constant current generator source, and the normalized reference output for the network is 209. Since this is greater than the sample, the register 120 is reset to provide a Q = 0 output for the remainder of the coding interval. The current generator is disconnected from input 196C. For the next digit, gate 130 is enabled and a 1 is initially applied to path 29F. As with the previous logic discussion, gate 156C has a 0 output and gate 158C is now enabled which connects input 196D to the constant current generator source. The normalized reference voltage is now 103 + 64 + 16 = 183, which is less than the sample. Register 126 is set to have a Q = 1 output and gate 130 remains enabled during the remainder of the coding interval. At the time that the 1 is strobed into register 126, the D7 clock applies a 1 to path 29G. Again, the logic operates to enable gate 158D which connects the constant current generator source to input 196E. This adds 8 to the normalized reference voltage of 183 giving a final value of 191. The code derived in the process of approximating the amplitude of the pulse sample is thus determined and the binary numbers representing the code are: 10101011.

The network logic control 42 and the weighted network 46 which are vital elements of the coder may also be used in decoding a PCM signal. These and other elements are arranged in a decoder block diagram FIG. 7. In the diagram, elements which perform the same function and operate in the same way in the decoder as they do in the coding process have been given the same identifying number as has been previously assigned to these elements in order to simplify the description.

Figure 7:
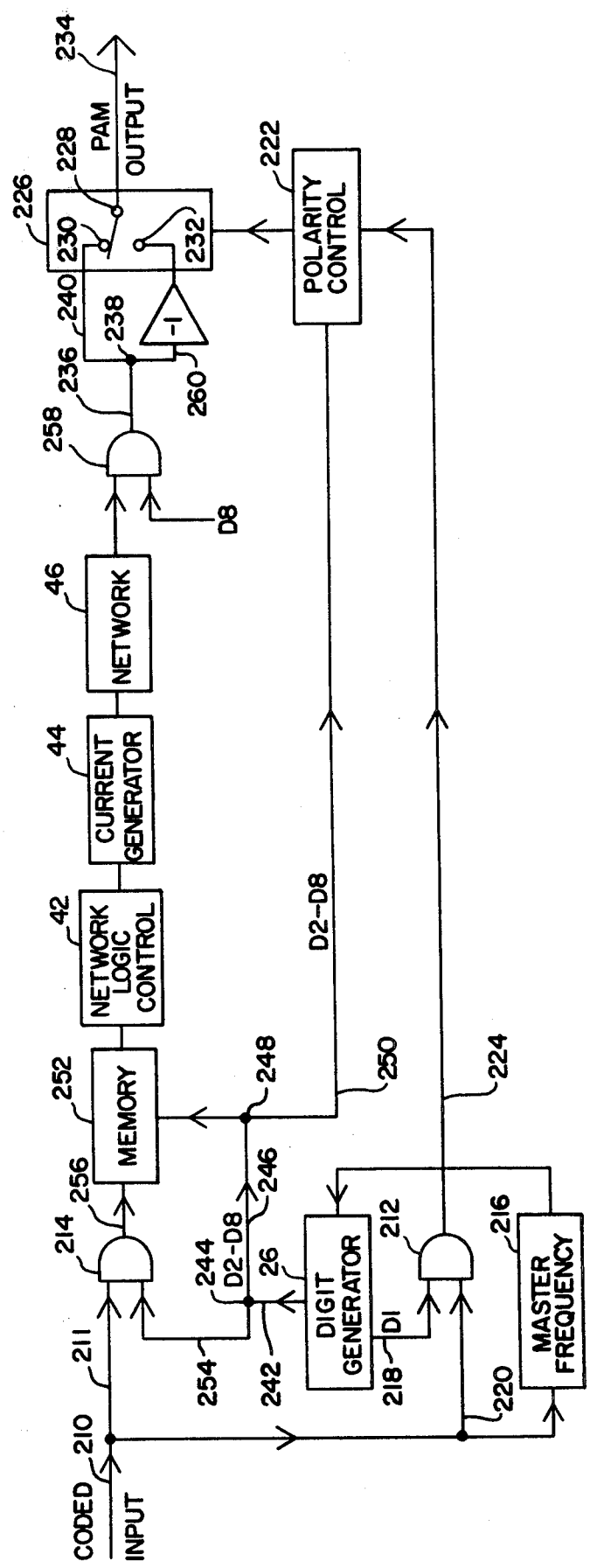
FIG. 7 is a block diagram of a decoder according to the teachings of this invention.

Referring now to FIG. 7, an input PCM signal is applied to the decoder path 210. As is well known in the art, synchronization information is normally added to the PCM signal in order that the timing at the receiving terminal may be synchronized with that of the transmitting terminal. It is known that PCM multiplexing is used to transmit a plurality of code words which are only spaced in time. Each code word may contain, as discussed above, eight digits. At the end of the series of code words, it is known to add synchronization information. This information, or similar information, is accepted by the master frequency 216 at the receiver and is used to synchronize the local digit generator with the incoming PCM wave.

On the basis of proper timing, a code word is selected which represent an amplitude sample of the original analog signal at the transmitting end of the system. For the case at hand, let us again assume that the PCM code word is made up of eight digits — a sign digit and seven amplitude digits. Of course, other numbers of digits could be employed. Further, let us assume that the expansion characteristic follows a $\mu$-law such as that shown in FIG. 2 where $\mu = 255$. The incoming PCM signal is applied to gates 212 and 214. The master frequency 216 includes an oscillator and frequency control circuits which use information obtained from the incoming synchronization pulses in order to synchronize the digit generator 26 for decoding purposes. Such techniques are well known in the art and therefore are not described in detail herein. At digit D1 time, a 1 is applied as one input to AND-gate 212 via path 218. Simultaneously, because of synchronization, the polarity bit of the PCM signal appears at the other input to gate 212 lead 220. If the PCM input to gate 212 is also a 1 during this digit time, a 1 appears at the gate 212 output and is applied to polarity control 222 via path 224. This would, according to the coding rules used hereinabove, indicate that the sign of the signal sample should be positive. Polarity control 222 operates on switch 226 so that armature 228 is connected to contact 230, i.e., the straightthrough path is used. The voltage output from network 46, which is assumed to always be positive, is then applied to the output path 234 via path 236, junction 238, path 236, contact 230, and armature 228. Conversely, a 0 PCM input at D1 time would provide a 0 output from gate 212 which, in turn, would cause polarity control to switch the armature of switch 226 to contact 232. The network output would then be inverted by inverting amplifier 10 before the output appears at path 234. Thus, the necessary negative amplitude may be readily obtained. A second input to polarity control 222 comes from digit generator 26 via path 242, junction 244, and path 246, junction 248, and path 250. The digit generator input holds the polarity control in the position, for the remainder of the sample coding interval, established by the control gate 212 during D1 time.

The decoding of a PCM input sample is obtained by successively reading the code digits following the sign digit determination into memory 252. The PCM input is applied as one input to gate 214 via path 211. Timing for the gate 214 is obtained from generator 26 via path 242, junction 244, and path 254. An AND-gate is shown which is one of a number of techniques that could be used. The output on path 256 will be a 1 or a 0 depending upon whether the PCM input is a 1 or a 0, respectively, at the input to gate 214. The memory 252 accepts the code digits and operates the network logic control which, in turn, directs the current generator output to the network sections (with modified weighting factors) as described hereinabove for the complete encoding process. This portion of the decoder is much like that of coding device which is connected to the output of code generator 17, via path 40, FIG. 1. Modification of the weighting factors permits decoding to the midpoint of the coding thresholds. However, in this portion of the circuit, the code digit input represents the sample amplitude so the feedback path 48 to comparator 4 is not needed. Instead, the code digits via logic control 42, FIG. 7, select the appropriate network portions, and current generator 44 supplies current to these selected inputs so that the voltage appearing on path 236 is directly representative of the sample amplitude. It is readily apparent that the network voltages will change with the input code and will reach the PAM sample value only during the D8 time. Therefore, a circuit is needed to prevent the intermediate output voltages from reaching the output path 234. Transmission gate 258 provides the circuit required since it is only enabled during the D8 time. The output from gate 258 is a PAM signal. This PAM signal is applied to junction 238 and paths 240 and 260. As discussed hereinabove, the representative amplitude output from network 46 is positive. Further, either a positive or negative PAM output can be obtained by selecting either the direct path or the inverted path by means of switch 226 as described in detail hereinbefore. Thus, decoding of the PCM sample is accomplished and, by using the appropriate weighting network, the decoding will follow the inverse of the coding characteristic so that the proper amplitude characteristic of the original signal is obtained. Of course, because of quantization, the amplitude will not necessarily be the exact value of the original PAM sample.

While the coding process has been described in terms of a 15-segment companding characteristic which follows the $\mu$-law in which $\mu = 255$, it is apparent that this technique can be used in piece-wise linear approximations of other companding characteristics.

What is claimed is:

1. In a system using signals in analog form at one point and, at another point, pulses arranged in code groups, each of said code groups being derived from PAM samples, apparatus for effecting a nonuniform translation on a piece-wise linear basis from one of said forms to the other without substantial alteration of the information content which comprises:
    a current generator means;
    a digit generator providing a series of timed outputs, said digit generator providing at least one timed output at each of the digit times of the code;
    a weighted network means having a plurality of sections, equal in number to the number of segments of the piece-wise linear characteristic, each network section corresponding to a particular segment of the piece-wise linear characteristic, and each section having a like number of inputs for selective connection to said generator, thereby dividing each segment into a predetermined number of quantum steps;
    control means for interconnecting said generator and said network inputs in a logical manner to derive a succession of comparison voltages, one for each digit time, with the last comparison voltage approximating the amplitude of the sample within a quantum step, said last comparison voltage comprising the sum of the total network voltage for each network section preceding the segment within which the value of the amplitude sample lies plus the sum of the selected quantum steps of said segment;
    means for comparing the amplitude sample with the succession of comparison voltages;
    means for translating the comparator output into a series of code groups representative of the signal samples for transmission.

2. In a pulse code modulation system, apparatus for nonuniformly converting each PAM sample amplitude into a code word having a sign digit and a plurality of code digits which are representative of the sample amplitude, which comprises:
    a comparator having a first input which accepts the PAM sample, a second input which accepts a succession of reference voltages for comparison with said PAM sample and having two outputs, one of which is fixed during the coding interval for the sample and the other of which provides an output of one binary state in response to a positive amplitude difference, and an output of the other binary state in response to a negative amplitude difference;
    gating means having two inputs, with each input connected to one output of said comparator, said gating means providing an output of one binary state when the comparator outputs are of like state, and of the other binary state when the comparator outputs are of different states;
    digit generator means;
    coding means having one input connected to one output of said comparator, a second input connected to the output of said gating means, and the third input connected to said digit generator, said digit generator time sequencing the inputs from said comparator and said gating means to produce a sign digit at one output and a series of code digits at a plurality of other outputs;

current generator means;

a weighted network means having a plurality of sections, equal in number to the number of segments of the piece-wise linear characteristic, each network section corresponding to a particular segment of the piece-wise linear characteristic, and each section having a like number of inputs for selective connection to said generator, thereby dividing each segment into a predetermined number of quantum steps;

control means for interconnecting said generator and said network inputs in a logical manner to derive a succession of comparison voltages, one for each digit time, with the last comparison voltage approximating the amplitude of the sample within a quantum step, said last comparison voltage comprising the sum of the total network voltage for each network preceding the segment within which the value of the amplitude sample lies plus the sum of the selected quantum steps of said segment; and means for combining said sign digit and said code digits into a serial binary stream which is representative of said PAM sample.

3. In a pulse code modulation system, apparatus for nonuniformly translating, on a piece-wise linear basis, a pulse amplitude sample into a code word which has a sign digit and a plurality of code digits representative of the sample amplitude, which comprises:

means for comparing the PAM sample with a timed succession of selected reference voltages, taking the difference therebetween and providing binary output indications thereof;

coding means connected to receive the binary indications of said comparing means and responsive thereto to generate a PCM code word having a sign digit and a plurality of code digits;

current generator means;

a weighted network means having a plurality of sections, equal in number to the number of segments of the piece-wise linear characteristic, each network section corresponding to a particular segment of the piece-wise linear characteristic, and each section having a like number of inputs for selective connection to said generator, thereby dividing each segment into a predetermined number of quantum steps; and control means for interconnecting said generator and said network inputs in a logical manner to derive a succession of comparison voltages, one for each digit time, with the last comparison voltage approximating the amplitude of the sample within a quantum step, said last comparison voltage comprising the sum of the total network voltage for each network section preceding the segment within which the value of the amplitude sample lies plus the sum of the selected quantum steps of said segment.

4. In a PCM system, coding apparatus at a transmitting terminal for nonuniform coding, on a piece-wise linear basis, of a series of PAM amplitude samples into PCM code words for transmission, and decoding apparatus at a receiving terminal which accepts the PCM code words and converts them into a series of PAM amplitude samples in accordance with the nonuniform coding technique, which comprises:

means for storing, at the transmitting terminal, each PAM amplitude sample for the coding time interval;

current generator means at said transmitting terminal;

a weighted network means having a plurality of sections, equal in number to the number of segments of the piece-wise linear characteristic, each network section corresponding to a particular segment of the piece-wise linear characteristic, and each section having a like number of inputs for selective connection to said generator, thereby dividing each segment into a predetermined number of quantum steps;

control means for interconnecting said generator and said network inputs in a logical manner to derive a succession of comparison voltages, one for each digit time, with the last comparison voltage approximating the amplitude of the sample within a quantum step, said last comparison voltage comprising the sum of the total network voltage of each network section preceding the segment within which the value of the amplitude sample lies, plus the sum of the selected quantum steps of said segment;

means for comparing the amplitude sample with the timed succession of selected reference voltages, said comparing means being responsive to the amplitude and sign of the voltage difference between the PAM sample amplitude and the selected voltages and providing a binary indication thereof;

coding means operatively connected to receive the binary indications from said comparing means, said coding means generating a PCM code word having a sign digit and a plurality of code digits in response to said binary indications for transmission;

digit generation means at the receiving terminal;

a first gating means having one input connected to the incoming line, a second input connected to the receiving digit generator and having an output, the first gating means being responsive to the first digit of the code word to establish polarity of the PAM sample;

a second gating means having one input connected to the incoming line, a second input connected to the receiving digit generator and an output, the second gating means responsive to the remaining digits of the code word;

memory means having an input operatively connected to the output of the second gating means and having a plurality of outputs;

a current generator, at said receiving terminal, having a plurality of inputs and a plurality of outputs;

a weighted network, at said receiving terminal, having a plurality of sections, equal in number to the number of segments of the piece-wise linear characteristic, each network section corresponding to a particular segment of the piece-wise linear characteristic, and each section having a like number of inputs for selective connection to said generator, thereby dividing each segment into a predetermined number of quantum steps;

network logic control means at said receiving terminal having a plurality of inputs connected to the output of the memory means, said control means operatively connecting selected outputs of said generator to inputs of the network section to derive a PAM signal amplitude, representative of the PCM code group, said PAM signal amplitude comprising the sum of the total network voltage for each network section preceding the segment within which the value of the amplitude sample lies plus the sum of the selected quantum steps of said segment;

a third gating means having one input connected to the output of said receiving network means, a second input operatively connected to the receiving digit generator and responsive to the last digit of the code word and an output;

a junction connected to the output of the third gating means, the junction providing two outputs, a first output voltage which is the same in amplitude and sign as the input voltage and the second output voltage which has the same amplitude but is opposite in sign to the input voltage;

a polarity control having one input connected to the receiving digit generation means and a second input connected to the output of said first gating means and having an output; and switching means having one input connected to the first input of said junction, a second input connected to the second input of said junction and a third input connected to the output of said polarity control means; the switching means providing a PAM sample at its output which is representative of the amplitude and sign of the PCM code word.

5. In a system using signals in analog form at one point and, at another point, pulses arranged in code groups, each of said code groups being derived from PAM samples, apparatus for effecting a nonuniform translation on a piecewise linear basis from one of said forms to the other, without substantial alteration of the information content which comprises:

current generator means;

a digit generator providing a series of timed outputs, said digit generator providing at least one timed output at each of the digit times of the code;

a weighted network means having a plurality of sections, equal in number to the number of segments of the piecewise linear characteristic, each network section corresponding to a particular segment of the piecewise linear characteristic, and each section having a like number of inputs for selective connection to said generator, thereby dividing each segment into a predetermined number of quantum steps;

control means for interconnecting said generator and said network inputs in a logical manner to derive a succession of comparison voltages, one for each digit time, with the last comparison voltage approximating the amplitude of the sample within a quantum step, said last comparison voltage comprising the sum of the total network voltage for each network section preceding the segment within which the value of the amplitude sample lies plus the sum of the selected quantum steps of said segment;

means for storing a PAM sample having an input connected to receive a PAM sample and an output;

a first differential comparator means having one input connected to the output of the PAM holding means, a second input connected to the output of the weighted network means, the first comparator providing a binary output of 1 or 0 in response to the comparison voltage from the weighting network, when the amplitude sample is of a first polarity, and providing a fixed binary output whenever the PAM sample amplitude is of a second polarity;

an inverter means having its input connected to the output of said PAM holding means and an output;

a second differential comparator means having one input connected to the output of said inverter means and a second input connected to the output of the weighted network means, the second comparator providing a binary output of 1 or 0 in response to the comparison voltage from the weighting network when the amplitude sample is of a second polarity, and providing a fixed binary output whenever the PAM sample amplitude is of a first polarity;

a gating means having one input connected to the output of the first differential comparator and a second input connected to the output of the second differential comparator, said gating means providing a binary output of 1 or 0 in response to the binary state of the differential comparator which is responsive to the comparison voltage; and coding means having one input connected to the output of said gating means and a second input connected to the output of the differential comparator means, the coding means providing a binary output at each of the digit times of the permutation code.

6. In a PCM system, decoding apparatus for uniform decoding, on a piecewise linear basis, of a series of PCM code words to convert each word into a PCM amplitude sample, which comprises:

a weighted resistance network means having a plurality of sections, equal in number to the number of segments of the piecewise linear characteristic, each network section corresponding to a particular segment of the piecewise linear characteristic, and each section having a like number of inputs;

a digit generator means having a plurality of outputs, at least one for each digit time of the pulse code group;

current generator means;

a first gating means having an input connected to the output of the weighted network and an output, the gating means being enabled at the $n^{th}$ digit time of the permutation code;

a second gating means having one input operatively connected to receive the incoming pulse code groups, a second input connected to outputs of the digit generator means so that the second gating means is enabled during the digit times of the n-1 amplitude digits and an output;

memory means operatively connected to the output of said second gating means, the memory means storing the n-1 digits for the duration of the coding interval, and having a plurality of outputs, a network logic control having a plurality of inputs operatively connected to the outputs of a memory means, the network logic control being responsive to the pulse code for enabling selected current generator means;

a third gating means having one input operatively connected to receive the incoming pulse code groups, a second input connected to an output of the digit generator means so that the third gating means is enabled only during the first digit time and an output, the output signal is binary and is representative of the polarity of the amplitude sample;

a polarity indicator means having an output, on input connected to the output of the third gating means and responsive thereto to establish a polarity signal indication at the output, a second input connected to the digit generator means and responsive to the output for each of the amplitude digit times to maintain the polarity signal indication throughout the decoding interval;

inverter means having an input operatively connected to said first gating means and an output;

switching means having one input operatively connected to the output of said first gating means, a second input operatively connected to the output of said inverter means, an output and a third input connected to the output of said polarity indicator means and responsive to the polarity indicator signal to connect the output of the switching means to the output of the first gating means or to the output of the inverter means for the duration of the decoding interval.

* * * * *